United States Patent [19]

Galasso et al.

[11] Patent Number: 4,487,799
[45] Date of Patent: Dec. 11, 1984

[54] PYROLYTIC GRAPHITE PRETREATMENT FOR CARBON-CARBON COMPOSITES

[75] Inventors: Francis S. Galasso, Manchester; Richard D. Veltri, East Hartford, both of Conn.

[73] Assignee: United Technologies Corporation, Hartford, Conn.

[21] Appl. No.: 576,774

[22] Filed: Feb. 3, 1984

Related U.S. Application Data

[63] Continuation of Ser. No. 391,614, Jun. 24, 1982, abandoned.

[51] Int. Cl.$^3$ .......................... B32B 7/02; B32B 9/00; C23C 11/08
[52] U.S. Cl. .................... 428/334; 428/408; 427/249; 427/252; 427/255.1; 427/255.2; 427/402
[58] Field of Search ............... 428/408, 334; 427/249, 427/245, 255.2, 255.1, 252

[56] References Cited

U.S. PATENT DOCUMENTS

| | | | |
|---|---|---|---|
| 3,853,586 | 12/1979 | Olcott | 428/408 X |
| 3,969,130 | 7/1976 | Bokros | 428/408 X |
| 3,980,105 | 9/1976 | Myskowski | 428/408 X |
| 4,029,844 | 6/1977 | Olcott | 428/367 |
| 4,241,104 | 12/1980 | Torbet | 428/408 X |
| 4,409,048 | 10/1983 | Hatch et al. | 428/408 |

Primary Examiner—Patricia C. Ives
Attorney, Agent, or Firm—Charles E. Sohl

[57] ABSTRACT

Carbon-carbon composites are prepared to receive a subsequent protective coating by having a thin layer (1 to 5 mils) of pyrolytic graphite applied to its surface. The graphite layer improves the performance of subsequent protective coatings and is especially useful on carbon-carbon composites having a positive coefficient of thermal expansion.

4 Claims, No Drawings

PYROLYTIC GRAPHITE PRETREATMENT FOR CARBON-CARBON COMPOSITES

This is a continuation of application Ser. No. 391,614 filed on June 14, 1982, now abandoned.

DESCRIPTION

1. Technical Field

This invention concerns the production of improved silicon carbide base coatings for carbon-carbon materials.

2. Background Art

Carbon-carbon composites are a class of unique materials whose properties, especially at elevated temperatures, make them attractive for various aerospace applications. The materials are composites, although all of the composite elements are comprised essentially of carbon, in its various allotropic forms. Carbon-carbon materials are produced starting with organic precursor fibers such as polyacrylonitrile, rayon or pitch. Such fibers are usually produced in bundles (yarn), often by an extrusion process. The precursor fibers are heated in an inert atmosphere to pyrolyze or carbonize them and may then be heated to a higher temperature (e.g. 4000° F., 2204° C.,) to form graphite fibers. These carbon or graphite materials may then be laid down, woven, or interleaved to form what are referred to as 1D, 2D, 3D, etc. structures where D stands for direction (i.e. in a 2D structure fibers are laid in two, usually orthogonal directions).

These woven structures can then be impregnated with a pitch or resin material which is converted to carbon and then graphite. In this process, hot pressing is also employed to obtain a dense structure. Repeated impregnation steps can be employed to increase density.

An alternative processing scheme is to use chemical vapor deposition (CVD) to deposit a pyrolytic graphite matrix.

The finished product is 90+% carbon but by virtue of the fiber alignment and other processing details such as densification, has exceptional mechanical properties when compared with other carbon type materials. The mechanical properties are constant, or even increase slightly, with temperatures up to about 4000° F. (2204° C.). This temperature capability makes carbon-carbon materials exceptionally attractive for various aerospace applications including gas turbine engines. The obvious drawback is the susceptibility of carbon-carbon materials to oxidation. The present invention concerns a coating a protect carbon-carbon materials from catastrophic oxidation at temperatures up to at least 2500° F. (1371° C.).

It is known in the prior art to use SiC conversion coatings to protect carbon-base materials, including carbon-carbon composites. Such coatings are conversion coatings because the surface of the article to be coated is converted to SiC by reacting it with silicon. Pack coating processes are popular. A carbon article can be embedded and heated in a pack material which will produce Si or Si compound vapors when heated. Specifically, pack compositions based on $Al_2O_3$, Si and $SiO_2$ are known. An apparent problem with such coatings on carbon-carbon materials is that coating thickness varies because the diffusion of Si into the composite varies depending upon whether the Si is diffused into the fibers or matrix.

The basic concept of pack derived coatings to protect carbon-base materials appears in U.S. Pat. No. 3,095,316 and in the SAMPE Conference Proceedings, 1975, Vol. 7, pp. 319–336 by D.C. Rogers et al.

U.S. Pat. No. 3,369,920 describes a basic and preferred method for applying pyrolytic graphite coatings. This patent is incorporated herein by reference. A particular feature of the invention described is the use of a reduced pressure atmosphere to provide an improved and uniform pyrolytic graphite coating.

U.S. Pat. No. 3,385,723 describes a method for coating a carbon article with highly pure beta silicon carbide. The method involves depositing a thin layer of high purity carbon on the surface of the carbon article to be coated, and then converting this high purity graphite material to high purity silicon carbide material through reacting material with pure silicon which is applied in the form of powder.

It is an object of this invention to describe a method for producing an improved pack derived coating on carbon-base materials, specifically on carbon-carbon materials.

DISCLOSURE OF INVENTION

According to the present invention, carbon-carbon composite materials are prepared to receive a subsequent SiC conversion coating by having a thin layer of pyrolytic graphite applied to the surfaces to be coated. The graphite layer is thin (1–5 mils), dense and adherent, and may be applied by flowing a mixture of argon and methane (1:1 to 1:20) at a reduced pressure (10–40 Torr) over the carbon-carbon substrate which is held at an elevated temperature (1800° C.–2500° C.). The thickness of the subsequent SiC conversion coating preferably exceeds the thickness of the graphite layer. The presence of the graphite layer renders the subsequent SiC coating substantially more uniform and protective.

The foregoing, and other features and advantages of the present invention, will become more apparent from the following description.

BEST MODE FOR CARRYING OUT THE INVENTION

Carbon-carbon composites may be given a protective coating by partially converting the surface of the material to an oxidation resistant material. One commonly used family of coating processes utilizes silicon to convert the surface of carbon-base materials to silicon carbide. For example, the carbon-carbon composite material may be dipped in molten silicon or exposed to silicon vapor to cause the surface of the material to be converted to silicon carbide. A common coating technique employed in connection with carbon-carbon composites is a pack coating technique which develops a thin layer of silicon carbide on the surface. This is a form of vapor deposition and uses a pack which produces vapor or Si and/or metastable Si compounds. Thus, for example, a carbon-carbon article may be embedded in powder mixture containing 10% $Al_2O_3$, 60% SiC, and 30% Si, and the pack and article heated to a temperature of about 1700° C. (e.g. 1600° C.–1800° C.) for a period of several (e.g. 1 to 8) hours during which time, a silicon carbide conversion surface layer is produced. The surface layer is produced by the vapor transport of silicon or a metastable silicon compound from the pack material to the article and the combination or reaction of the silicon with surface and subsurface carbon to form the desired silicon carbide.

It is highly desired that the silicon carbide surface coating be uniform in thickness and density so as to afford uniform resistance to oxidation so as to avoid preferential oxidation. In carbon-carbon materials, composed of graphite or carbon fibers in a carbon matrix, diffusion of silicon through the fibers will occur at a different rate than diffusion of silicon within the matrix material. Even within the fibers, the diffusion of silicon may occur at different rates depending upon whether the diffusion direction is along the axis of the fiber or in a radial direction. This uneven diffusion behavior coupled with the possibility that the carbon-carbon material may not be 100% dense, leads to the production of an undesirably variable thickness surface coating.

The present invention substantially avoids this problem by providing on the surface of the carbon-carbon composite material an initial thin continuous layer of pyrolytic graphite. For reasons not entirely understood, this results in a surprising degree of uniformity in any subsequently applied diffusion or conversion SiC layer. In particular, the precoating with pyrolytic graphite produces outstanding results on carbon-carbon materials having a positive coefficient of thermal expansion.

Preferred conditions for depositing pyrolytic graphite on the surface of the carbon-carbon material are to heat the substrate to a temperature of between 1800° C. and 2500° C. while maintaining the substrate in a reduced pressure chamber at a pressure of 10–40 Torr while flowing a mixture of methane and argon over the surface of the sample. The ratio of methane to argon can range from about 1:1 to about 20:1, but is preferably about 4:1. In the case of a small chamber having a 2 inch (5.08 cm) inside diameter of 4 inch (10.2 cm) length, 100 cc/min of $CH_4$ and 25 cc/min of argon were flowed through the chamber to produce the desired coating. The coating thickness is preferably from 1–5 mils.

After the pyrolytic graphite coating is applied, it can then be converted to silicon carbide using any one of numerous well known processes. We prefer the use of a pack deposition process employing a pack mixture containing about 10% $Al_2O_3$, about 60% SiC and about 30% Si powder. Especially desirable results are obtained by adding a small amount of boron to this pack mixture, on the order of 1%, as described in commonly assigned U.S. patent application Ser. No. 391,613 entitled "Formation of Improved SiC Conversion Coatings on Carbon-Base Materials", filed on even date herewith. This pack mixture provides a suitable silicon carbide conversion coating when it is heated to a temperature of about 1500° C.–1700° C. The coating time is preferably controlled so that the depth of the silicon carbide conversion layer exceeds the depth of the initial pyrolytic graphite layer thereby ensuring that it is bonded to the original carbon-carbon substrate.

The importance of the pyrolytic graphite precoating step can be appreciated by the following example. A carbon-carbon composite material produced by the FMI Corportation was employed. The FMI carbon-carbon composite contained high modulus graphite fibers in a 2D configuration with a matrix derived from pitch. This material contained a substantial amount of porosity although it is not typical of carbon-carbon materials.

One sample of this material received a 1 mil coating of pyrolytic graphite, a 5 mil coating of pack deposited silicon carbide, and an 8 mil overcoating of CVD silicon nitride. A second sample received an identical silicon carbide pack coating and CVD silicon nitride outer layer, but without the pyrolytic graphite preliminary layer. When tested in air at 2000° F. (1093° C.) for a period of one hour, the pyrolytic graphite containing the sample lost less than 1% of its weight while the sample without the pyrolytic coating lost about 5% of its weight.

Although this invention has been shown and described with respect to detailed embodiments thereof, it will be understood by those skilled in the art that various changes in form ynd detail thereof may be made without departing from the spirit and scope of the claimed invention.

We claim:

1. A method for preparing a carbon-carbon composite article to receive subsequent protective coating which comprises applying a 1–5 mil layer of pyrolytic graphite to the substrate surface, so that compositional and crystallographic variations in the carbon-carbon article are masked and do not affect the subsequent protective coating.

2. In the method of protecting carbon-carbon materials from environmental degradation by diffusing silicon into the surface to produce a SiC based surface layer, the improvement which comprises:
applying a 1–5 mil layer of pyrolytic graphite to the surface of the carbon-carbon material prior to diffusing silicon into the article surface.

3. A method as in claim 2 in which the pyrolytic graphite layer is applied by heating the material surface and flowing a mixture of methane and argon over the surface.

4. A method as in claim 2 in which the SiC layer is produced by embedding the pyrolytic graphite coated material in a pack containing Si, SiC and $Al_2O_3$ and heating to an elevated temperature.

* * * * *

UNITED STATES PATENT AND TRADEMARK OFFICE
CERTIFICATE OF CORRECTION

PATENT NO. : 4,487,799
DATED : December 11, 1984
INVENTOR(S) : FRANCIS S. GALASSO AND RICHARD D. VELTRI It is certified that error appears in the above-identified patent and that said Letters Patent is hereby corrected as shown below:

Column 1, line 6, "June 14" should be -- June 24 --

Column 4, line 26, "ynd" should be -- and --

Signed and Sealed this

Sixteenth Day of July 1985

[SEAL]

Attest:

DONALD J. QUIGG

Attesting Officer    Acting Commissioner of Patents and Trademarks